United States Patent [19]
Sinh et al.

[11] Patent Number: 5,434,518
[45] Date of Patent: Jul. 18, 1995

[54] ECL-TO-BICOMS/CMOS TRANSLATOR
[75] Inventors: Nguyen Sinh, San Jose; Loren Yee, Milpitas, both of Calif.
[73] Assignee: National Semiconductor Corporation, Santa Clara, Calif.
[21] Appl. No.: 239,925
[22] Filed: May 9, 1994

Related U.S. Application Data

[63] Continuation of Ser. No. 955,696, Oct. 2, 1992, Pat. No. 5,327,025.
[51] Int. Cl.6 .................. H03K 19/0175; H03K 19/08
[52] U.S. Cl. ....................................... 326/66; 326/84; 326/17
[58] Field of Search ............... 307/475, 443, 446, 570; 326/66, 84, 110, 21, 17

[56] References Cited

U.S. PATENT DOCUMENTS

| | | | |
|---|---|---|---|
| 4,301,833 | 11/1981 | Taylor | 307/446 |
| 4,356,409 | 10/1982 | Masuda et al. | 307/475 |
| 4,437,171 | 3/1984 | Hudson et al. | 365/177 |
| 4,612,458 | 9/1986 | Vasseghi et al. | 307/446 |
| 4,697,109 | 9/1987 | Honma et al. | 307/475 |
| 4,748,346 | 5/1988 | Emori | 307/270 |
| 4,755,693 | 7/1988 | Suzuki et al. | 307/296 R |
| 4,806,799 | 2/1989 | Pelley, III et al. | 307/475 |
| 4,829,359 | 5/1989 | O et al. | 357/42 |
| 4,841,175 | 6/1989 | De Man et al. | 307/475 |
| 4,864,159 | 9/1989 | Cornelissen | 307/264 |
| 4,866,304 | 9/1989 | Yu | 307/446 |
| 4,939,393 | 7/1990 | Petty | 307/475 |
| 5,012,137 | 4/1991 | Muellner | 307/475 |
| 5,019,726 | 5/1991 | Guo | 307/475 |
| 5,059,821 | 10/1991 | Murabayashi et al. | 307/446 |
| 5,153,465 | 10/1992 | Sandhu | 307/475 |
| 5,329,183 | 7/1994 | Tamegaya | 307/475 |
| 5,331,224 | 7/1994 | Ohannes et al. | 307/446 |

FOREIGN PATENT DOCUMENTS

| | | | |
|---|---|---|---|
| 0212004A2 | 3/1987 | European Pat. Off. | H03K 10/094 |
| 0406609A3 | 1/1991 | European Pat. Off. | H03K 19/018 |
| 04265015 | 9/1992 | Japan | H03K 19/075 |

OTHER PUBLICATIONS

Textbook by H. B. Bakoglu, "Circuits, Interconnections, and Packaging for VLSI", 1990, pp. 184–193.
S. H. K. Embabi, A. Bellaouar and M. I. Elmasry, "Analysis and Optimization of BiCMOS Digital Circuit Structures", IEEE Journal of Solid-State Circuits, vol. 26, No. 4, Apr. 1991, pp. 676–679.
Makoto Suzuki, Suguru Tachibana, Atsuo Watanabe, Shoji Shukuri, Hisayuki Higuchi, Takahiro Nagano, and Katushiro Shimohigashi, "A 3.5-ns, 500-mW, 16-kbit BiCMOS ECL RAM", IEEE Journal of Solid-State Circuits, vol. 24, No. 5, Oct. 1989, pp. 1233–1235.
Masataka Matsui, Hiroshi Momose, Yukihiro Urakawa, Takeo Maeda, Azuma Suzuki, Nobuaki Urakawa, Katsuhiko Sato, Junichi Matsunaga and Kiyofumi Ochii, "An 8-ns 1-Mbit ECL BiCMOS SRAM with Double-Latch ECL-to-CMOS-Level Converters", IEEE Journal of Solid-State circuits, vol. 24, No. 5, Oct. 1989, pp. 1226–1232.
U.S. patent application, Ser. No. 586,068, Filed Sep. 21, 1990, Inventor Robert Bosnyak, Assignee National Semiconductor Corporation, now U.S. Pat. No. 5,068,551.

*Primary Examiner*—David R. Hudspeth
*Assistant Examiner*—Jon Santamauro
*Attorney, Agent, or Firm*—Limbach & Limbach; H. Donald Nelson; Richard J. Roddy

[57] ABSTRACT

An ECL-to-BiCMOS/CMOS translator for translating a pair of differential ECL level signals into a BiCMOS/CMOS level signal is disclosed. The translator includes an output stage having an output node and a first output switching means for coupling the output node to a first voltage supply and a second output switching means for coupling the output node to a second voltage supply. A first input stage activates the first output switching means of the output stage in response to one of the differential ECL signals, and a second input stage activates the second output switching means of the output stage in response to the other differential ECL signal. The first input stage includes a first input switching means for coupling a first resistive element between the first voltage supply and the output node of the output stage, and the second input stage includes a second input switching means for coupling a second resistive element between the first voltage supply and the second voltage supply.

16 Claims, 4 Drawing Sheets

ECL-TO-BICOMS/CMOS TRANSLATOR

This is a continuation of application Ser. No. 07/955,696 filed on Oct. 2, 1992, now U.S. Pat. No. 5,327,025.

BACKGROUND OF THE INVENTION

1. Field of the Invention

The present invention relates to circuitry used for interfacing different families of logic circuits, and more particularly, to an emitter coupled logic (ECL) to bipolar complementary metal oxide semiconductor (BiCMOS) and complementary metal oxide semiconductor (CMOS) translator.

2. Description of the Related Art

Situations often arise where certain portions of a digital system require high-speed logic gates while other portions of the system can tolerate low-speed logic gates. In these situations, it is advantageous to use more than one logic family because, where low-speed can be tolerated, a low-speed family such as CMOS will dissipate less power than a high-speed family such as ECL.

When more than one logic family is used in a system, it is necessary to take into account the fact that the output of one family may not be compatible with the input of another. In order to properly transfer data between different logic families, special interfacing circuits, or "translators," can be used to convert the logic signals generated by one family into signals which can be understood by a different family.

FIG. 1 illustrates a block diagram of a conventional ECL-to-CMOS translator 20. The translator 20 converts ECL level signals to CMOS level signals. During operation, an ECL level signal is received at node 22. The dynamic signal range for ECL logic is about −1.7 to −1.4 Volts for logical low ("0") and about −0.9 to −0.8 Volts for logical high ("1"). An ECL receiver circuit 24 converts the received ECL signal to a pair of differential ECL level signals (i.e., complementary ECL signals). The differential ECL signals are carried by lines 26 and 28 to a translator circuit 30. The translator circuit 30 converts the differential ECL level signals to a single CMOS level signal. The single CMOS level signal is output at node 32. The dynamic signal range for CMOS logic is about −5.0 to −4.8 Volts for logical low ("0") and about −0.4 to 0.0 Volts for logical high ("1").

FIG. 2 illustrates a circuit implementation of the conventional ECL-to-CMOS translator 20 of FIG. 1. The ECL receiver circuit 24 is basically a current-mode logic (CML) gate, and its operation is well known in the art. Specifically, bipolar transistor Q1, which receives the ECL input signal at its base, is connected in emitter follower configuration to a voltage-comparator circuit which is constructed from bipolar transistors Q2 and Q3 and resistors R1 and R2. Voltage comparator circuits are the basic components of ECL and CML gates. Lines 26 and 28, which carry the pair of differential ECL signals, are connected to the collectors of transistors Q3 and Q2, respectively.

The translator circuit 30 includes p-channel MOSFET transistors MP1 through MP3, n-channel MOSFET transistors MN1 through MN5, and bipolar transistors Q4 and Q5. Transistor Q4 has its collector connected to a first voltage source which supplies a voltage roughly equal to that of a CMOS logical high, i.e., about 0.0 Volts. Transistor Q5 has its emitter connected to a second voltage source which supplies a voltage roughly equal to that of a CMOS logical low, i.e., about −5.2 Volts. The emitter of transistor Q4 and the collector of transistor Q5 are connected together and form output node 32.

Translator circuit 30 generates CMOS level signals on output node 32 by switching only one of transistors Q4 and Q5 on at a time. When transistor Q4 is switched on, transistor Q5 is off, and output node 32 is pulled up to a CMOS logical high, i.e., about −0.4 Volts. When transistor Q5 is switched on, transistor Q4 is off, and output node 32 is pulled down to a CMOS logical low, i.e., about −4.8 Volts.

The pair of differential ECL signals are received at the gates of transistors MP1 and MP2 via lines 26 and 28, respectively. Transistors MP1 through MP3 and MN1 through MN5, in response to the differential ECL signals, switch transistors Q4 and Q5 on and off. Specifically, when line 26 carries a low signal, and line 28 carries a high signal, transistor MP1 switches on and transistor MP2 switches off. Because transistor MP1 is on, transistor MN2 switches on and causes the gates of transistors MP3, MN3, and MN4 to be pulled low. Transistor MP3 switches on and causes the base of transistor Q4 to be pulled high, thus, switching transistor Q4 on. Because transistor Q4 is on, a high signal is received at the gate of transistor MN5 which switches transistor MN5 on. The base of transistor Q5 is pulled low which switches transistor Q5 off.

conversely, when line 26 carries a high signal, and line 28 carries a low signal, transistor MP1 switches off and transistor MP2 switches on. Because transistor MP2 is on, the gates of transistors MP3, MN3 and MN4 are pulled high. Transistor MN3 switches on which pulls the base of transistor Q4 low, thus, switching transistor Q4 off. Transistor MN5 remains off which permits transistor Q5 to switch on.

The conventional ECL-to-CMOS translator 20 of FIGS. 1 and 2 has a number of deficiencies. First, due to the large number of transistors employed, the translator 20 tends to dissipate a large amount of power. Second, the large number of transistors require a period of time to complete the switching operation, which is too slow for many modern applications. Finally, the large number of transistors makes the circuit impractical for modern high density products; there are often space and layout problems which render the manufacture of the circuit economically unfeasible.

Thus, there is a need for an ECL-to-CMOS translator which dissipates less power, has fewer components, and has higher speed than conventional translators.

SUMMARY OF THE INVENTION

The present invention provides an ECL-to-BiCMOS/CMOS translator for translating a pair of differential ECL level signals into a BiCMOS/CMOS level signal. An output stage having an output node for outputting the BiCMOS/CMOS level signal is included, and the output stage further includes a first output switching means for coupling the output node to a first voltage supply and a second output switching means for coupling the output node to a second voltage supply.

A first input stage activates the first output switching means of the output stage in response to one of the differential ECL signals. The first input stage includes a first input switching means for coupling a first resistive element between the first voltage supply and the output node of the output stage.

A second input stage activates the second output switching means of the output stage in response to the other differential ECL signal. The second input stage includes a second input switching means for coupling a second resistive element between the first voltage supply and the second voltage supply.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 3:
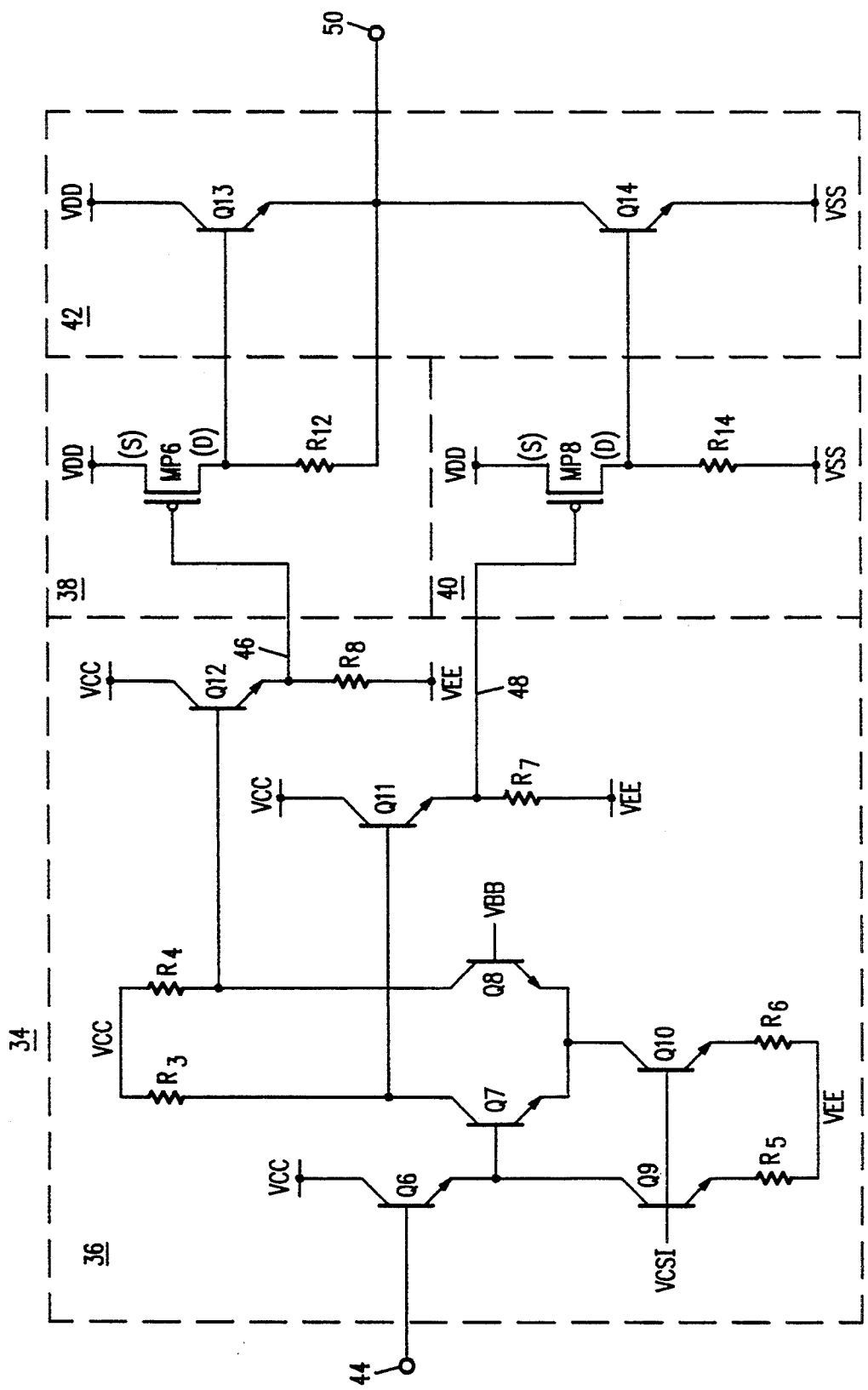
FIG. 3 is a schematic diagram illustrating a circuit embodiment of an ECL to BiCMOS/CMOS translator in accordance with the present invention.

Referring to FIG. 3, there is illustrated a circuit embodiment of an ECL-to-BiCMOS/CMOS translator 34 in accordance with the present invention. The translator 34 is ideal for converting ECL level signals to BiCMOS level signals. The dynamic signal range for BiCMOS logic is nearly the same as for CMOS logic, except that the voltage level for BiCMOS logical high ("1") is generally about one diode drop below the CMOS logical high. Thus, BiCMOS logical high is about −0.7 Volts and BiCMOS logical low is about −5.0 Volts.

Because the BiCMOS and CMOS dynamic signal ranges are nearly the same, it is believed that the translator 34 will function adequately to convert ECL level signals to CMOS level signals as well. In other words, it is believed that if CMOS devices are connected to node 50, the BiCMOS logical high signals generated at node 50 will be adequate for switching the CMOS devices to a high state, and vice-versa. Thus, the translator 34 is referred to herein as an ECL-to-BiCMOS/CMOS translator because it is believed that the translator will adequately translate ECL level signals to signals which can be utilized by both BiCMOS and CMOS logic families.

In general, the translator 34 operates by receiving an ECL level signal at node 44. An ECL receiver stage 36 converts the received ECL signal to a pair of differential ECL level signals. The differential ECL signals are carried by lines 46 and 48 to a first input stage 38 and a second input stage 40, respectively. An output stage 42, responsive to the first and second input stages 38 and 40, generates a BiCMOS/CMOS level signal on node 50.

The ECL receiver stage 36 is basically an ECL gate, and its operation is well known in the art. Specifically, a bipolar transistor Q6 receives the ECL input signal at its base. The collector of transistor Q6 is connected to a voltage supply VCC, and the emitter of transistor Q6 is connected to a voltage-comparator circuit constructed from bipolar transistors Q7 and Q8 and resistors R3 and R4. Resistors R3 and R4 preferably have a value of approximately 2.3 KΩ each. Transistors Q7 and Q8 have their emitters connected together and their collectors connected to resistors R3 and R4, respectively. The other terminals of resistors R3 and R4 are connected to voltage supply VCC. Voltage supply VCC is preferably tied to ground potential.

Figure 1:
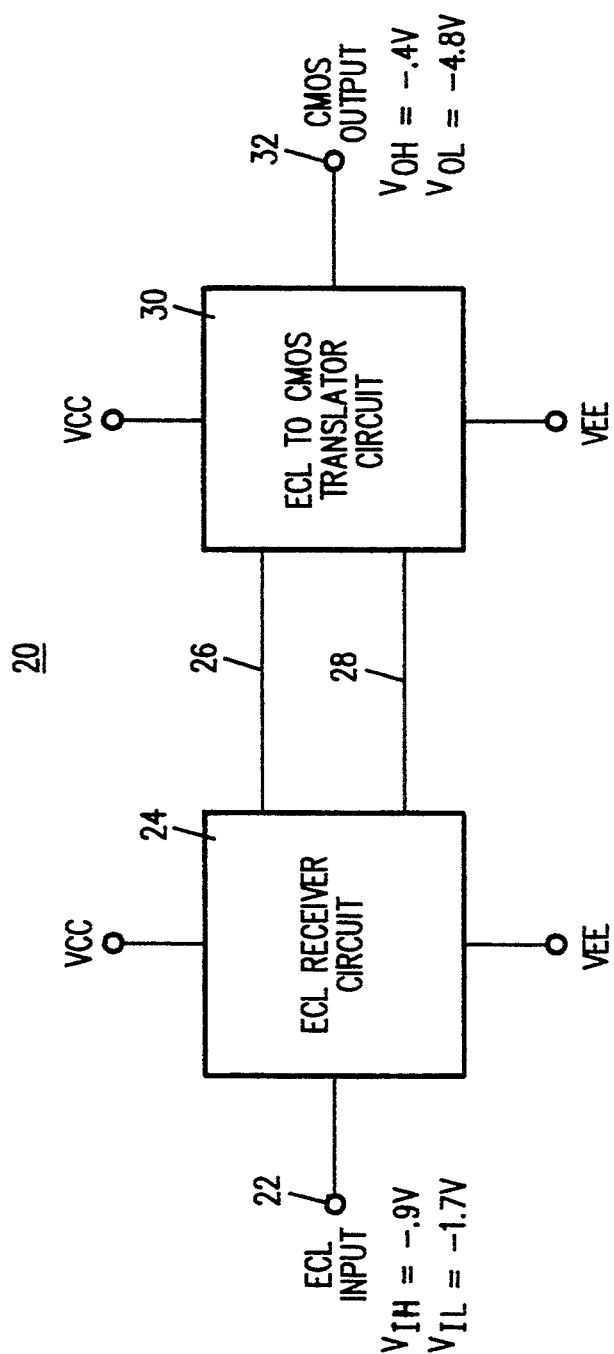
FIG. 1 is a block diagram illustrating a conventional ECL to CMOS translator.
Figure 2:
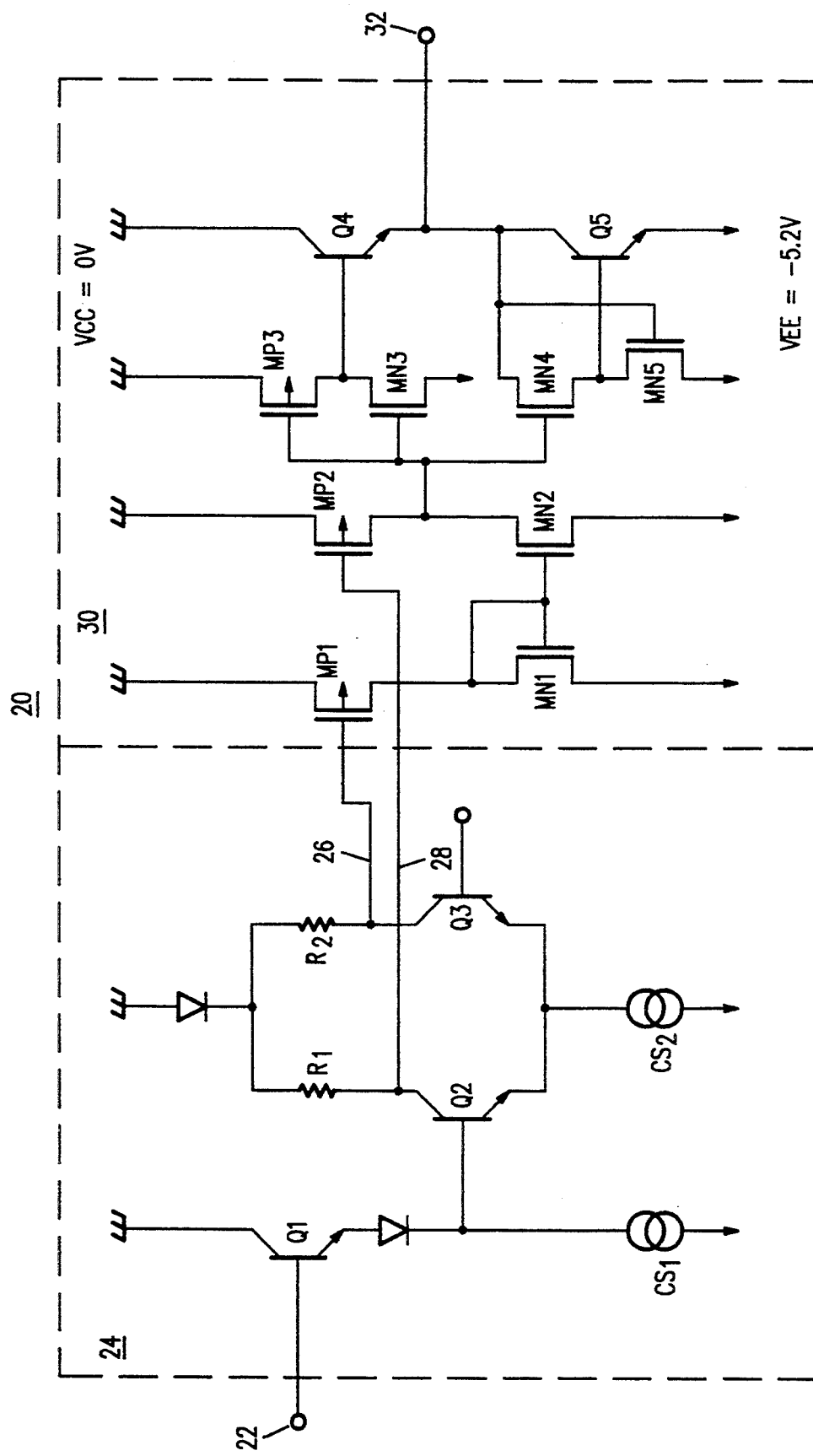
FIG. 2 is a schematic diagram illustrating the conventional ECL to CMOS translator of FIG. 1.

Instead of having current sources (as shown in FIG. 2) connected to the emitters of transistors Q6, Q7, and Q8, the emitter of transistor Q6 is connected to the collector of a bipolar transistor Q9, and the emitters of transistors Q7 and Q8 are connected to the collector of a bipolar transistor Q10. The emitters of transistors Q9 and Q10 are connected to resistors R5 and R6, respectively. Resistors R5 and R6 preferably have values of approximately 1600 Ω and 800 Ω, respectively. The other terminals of resistors R5 and R6 are connected to a voltage supply VEE, which preferably supplies a voltage of about −5.0 Volts. The bases of transistors Q9 and Q10 are connected to a voltage source VCSI, which preferably supplies a voltage of approximately 1.32 Volts above voltage supply VEE.

The collector of transistor Q7 is connected to the base of emitter follower bipolar transistor Q11, and the collector of transistor Q8 is connected to the base of emitter follower bipolar transistor Q12. The emitter of transistor Q11 is connected through a resistor R7 to voltage supply VEE, and the emitter of transistor Q12 is connected through a resistor R8 to voltage supply VEE. Resistors R7 and R8 preferably have values of approximately 8400 Ω each. The collectors of both transistors Q11 and Q12 are connected to voltage supply VCC.

Lines 46 and 48, which carry the pair of differential ECL signals generated by the ECL receiver stage 36, are connected to the emitters of transistors Q12 and Q11, respectively. The other end of lines 46 and 48 are connected to the first and second input stages 38 and 40, respectively.

Although a specific configuration of the ECL receiver stage 36 is shown in FIG. 3, it should be well understood that many different ECL or CML gate configurations will adequately serve the purpose of the ECL receiver stage 36. The primary objective of the ECL receiver stage 36 is to convert the single received ECL level signal into a pair of differential ECL level signals, and any circuit capable of accomplishing this objective will suffice. For example, the ECL receiver stage 24 of FIG. 2 may be used as the ECL receiver stage 36 of the present invention.

Furthermore, the ECL receiver stage 36 is not even needed if a pair of differential ECL signals, rather than a single ECL signal, are present in the system in which the translator is used. In this scenario the differential ECL signals would be connected directly to the first and second input stages 38 and 40.

The first and second input stages 38 and 40 control the output stage 42. The output stage 42 includes two bipolar transistors Q13 and Q14. The collector of transistor Q13 is connected to a voltage supply VDD which supplies a voltage roughly equal to that of a CMOS logical high, i.e., about 0.0 Volts. The emitter of transistor Q14 is connected to a voltage supply VSS which supplies a voltage roughly equal to that of a CMOS logical low, i.e., about −5.0 Volts. The emitter of transistor Q13 and the collector of transistor Q14 are connected together and form output node 50.

Output stage 42 generates BiCMOS/CMOS level signals on output node 50 by switching only one of transistors Q13 and Q14 on at a time. When transistor Q13 is switched on, transistor Q14 is switched off, and output node 50 is coupled to voltage supply VDD. Thus, output node 50 is pulled up to approximately a BiCMOS logical high, i.e., approximately 0.0 Volts less one diode drop, or about −0.7 Volts. When transistor Q14 is switched on, transistor Q13 is switched off, and output node 50 is coupled to voltage supply VSS. Thus, output node 50 i is pulled down to approximately a BiCMOS logical low, i.e., approximately −5.0 Volts.

The first input stage 38 activates transistor Q13 in response to one of the differential ECL signals. Specifically, the first input stage 38 includes a p-channel MOSFET transistor MP6 which receives one of the differential ECL signals at its gate via line 46. The source of transistor MP6 is connected to voltage source VDD. The drain of transistor MP6 is connected to the base of transistor Q13. The drain of transistor MP6 is also connected through a resistor R12 to the output node 50. When transistor MP6 is switched on, resistor R12 is effectively coupled between voltage supply VDD and output node 50. The resistor R12 preferably has a value of approximately 5 KΩ.

The second input stage 40 activates transistor Q14 in response to the other differential ECL signal. A p-channel MOSFET transistor MP8 receives the other differential ECL signal at its gate via line 48. The source of transistor MP8 is connected to voltage source VDD. The drain of transistor MP8 is connected to the base of transistor Q14. The drain of transistor MP8 is also connected through a resistor R14 to voltage source VSS. When transistor MP8 is switched on, resistor R14 is effectively coupled between voltage supply VDD and voltage supply VSS. The resistor R14 preferably has a value of approximately 6 KΩ.

During operation, when an ECL logical high is received at node 44, the ECL receiver stage 36, as is well known in the art, generates an ECL logical high on line 46, i.e., about −0.8 Volts, and an ECL logical low on line 48, i.e., about −2.2 Volts. The low signal on line 48 switches transistor MP8 on which causes current to flow through resistor R14. The approximate 0.7 Volt drop across resistor R14 causes the base of transistor Q14 to be pulled from −5.0 Volts up to about −4.3 Volts. This change in voltage at the base of transistor Q14 causes it to switch on. Because transistor Q14 is on, output node 50 is coupled to and pulled down to approximately VSS, or about −5.0 Volts. It should be noted that while transistor MP8 is switched on there is a steady current flowing through it, as well as resistor R14, in order to keep transistor Q14 switched on.

The high signal which is received at the gate of transistor MP6 via line 46 switches transistor MP6 off. Because transistor MP6 is off, a low signal is received at the base of transistor Q13 which causes the transistor to remain off. Thus, output node 50 remains coupled to and pulled down to VSS by transistor Q14.

When an ECL logical low is received at input node 44, the ECL receiver stage 36 generates an ECL logical low on line 46, i.e., about −2.2 Volts, and tan ECL logical high on line 48, i.e., about −0.8 Volts. The high signal on line 48 causes transistor MP8 to switch off. Current stops flowing through resistor R14, and the base of transistor Q14 is pulled back down to −5.0 Volts. The change in voltage at the base of transistor Q14 causes it to switch off.

The low signal on line 46 causes transistor MP6 to switch on. The base of transistor Q13 is pulled up to VDD, or about 0.0 Volts, which causes transistor Q13 to switch on. Output node 50 is pulled up to VDD less one diode drop, or about −0.7 Volts. It should be noted that while transistor Q13 is on, there is no steady current flow through transistor MP6. Power is conserved when there is no steady current flow.

Figure 4:
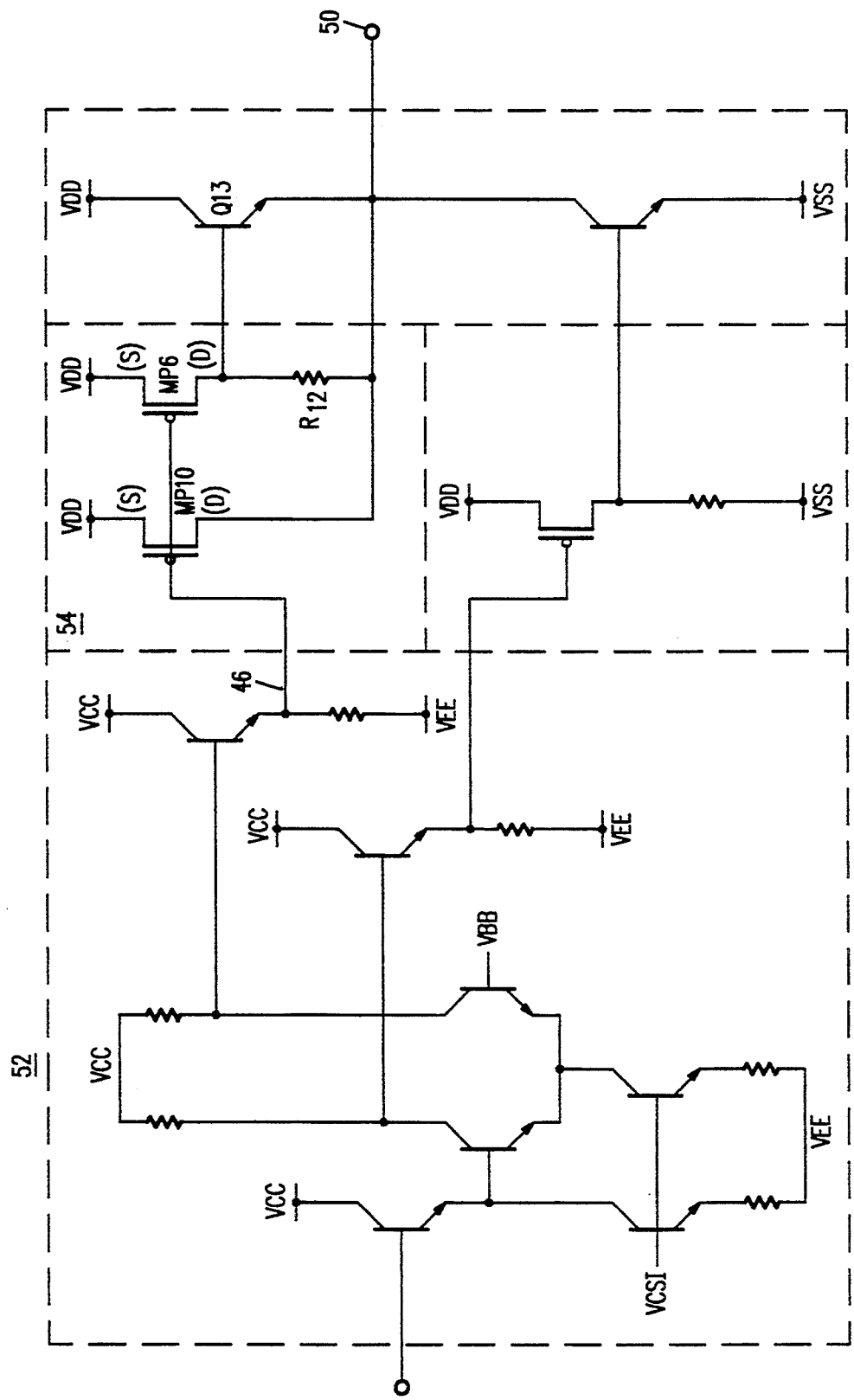
FIG. 4 is a schematic diagram illustrating a circuit embodiment of another ECL to BiCMOS/CMOS translator in accordance with the present invention.

Although it is believed that translator 34 of FIG. 3 will adequately translate ECL signals to both BiCMOS and CMOS level signals, FIG. 4 illustrates a circuit embodiment of a translator 52 in accordance with the present invention that is more suitable for converting ECL level signals to CMOS level signals. Translator 52 is identical to translator 34 in all respects except for the first input stage 54. An additional p-channel MOSFET transistor MP10 has been added to the first input stage 54. Specifically, the gate of transistor MP10 is connected to line 46 which carries one of the differential ECL signals. The source of transistor MP10 is connected to voltage supply VDD, and the drain is connected to output node 50.

The operation of translator 52 is nearly the same as translator 34 except for one small difference. As discussed above with respect to translator 34, when line 46 carries a low signal, transistor MP6 switches on which causes transistor Q13 to switch on. Node 50 is pulled up to a voltage level of VDD less one diode drop. However, in translator 52, transistor MP10 also switches on which effectively couples voltage supply VDD to output node 50. In other words, there is not a one diode voltage drop between voltage supply VDD and output node 50. Thus, the high output of translator 52 is approximately equal to VDD, or about 0.0 Volts, which is in accordance with the generally accepted CMOS dynamic signal range.

Similar to translator 34 of FIG. 3, it is believed that translator 52 of FIG. 4 will adequately translate ECL level signals to BiCMOS levels signals. Although translator 52 may be more suitable for CMOS logic levels, it is believed that because the dynamic signal ranges of BiCMOS and CMOS are nearly the same, translator 52 will function adequately for BiCMOS. Thus, translator 52 is also referred to herein as an ECL-to-BiCMOS/-CMOS translator.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An ECL-to-BiCMOS/CMOS translator for translating a pair of differential ECL level signals into a BiCMOS/CMOS level signal, the translator comprising:

an output stage having an output node for outputting the BiCMOS/CMOS level signal, the output stage further having a first output switching means for coupling the output node to a first voltage supply and a second output switching means for coupling the output node to a second voltage supply;

a first input stage for activating the first output switching means of the output stage in response to one of the differential ECL signals, the first input stage having a first field effect transistor for coupling a first resistive element between the first voltage supply and the output node of the output stage; and a second input stage for activating the second output switching means of the output stage in response to the other differential ECL signal, the second input stage having a second field effect transistor for coupling a second resistive element between the first voltage supply and the second voltage supply, the second field effect transistor conducting a steady DC current after the second output switching means is activated.

2. The ECL-to-BiCMOS/CMOS translator of claim 1, wherein the first and second output switching means of the output stage comprise bipolar transistors.

3. The ECL-to-BiCMOS/CMOS translator of claim 2, wherein:

the first field effect transistor of the first input stage comprises a P-channel transistor having its source connected to the first voltage supply, its drain connected to the base of the first output switching means of the output stage and to the first resistive element, and its gate connected to the differential ECL signal; and the second field effect transistor of the second input stage comprises a P-channel transistor having its source connected to the first voltage supply, its drain connected to the base of the second output switching means of the output stage and to the second resistive element, and its gate connected to the other differential ECL signal.

4. The ECL-to-BiCMOS/CMOS translator of claim 1, further comprising:

an ECL receiver means for receiving a signal ECL signal and for generating the pair of differential ECL signals in response thereto.

5. The ECL-to-BiCMOS/CMOS translator of claim 1, wherein the first input stage further comprises:

a third field effect transistor for coupling the first voltage supply to the output node of the output stage.

6. An ECL-to-BiCMOS/CMOS translator, comprising:

an output stage having an output node for outputting a BiCMOS/CMOS level signal, the output stage further having a first bipolar transistor for coupling the output node to a first voltage supply and a second bipolar transistor for coupling the output node to a second voltage supply;

a first input stage, responsive to a first one of a pair of differential ECL signals, for activating the first bipolar transistor of the output stage, the first input stage having a first P-channel transistor for coupling a first resistive element between the first voltage supply and the output node of the output stage; and a second input stage, responsive to a second one of the pair of differential ECL signals, for activating the second bipolar transistor of the output stage, the second input stage having a second P-channel transistor for coupling a second resistive element between the first voltage supply and the second voltage supply.

7. The ECL-to-BiCMOS/CMOS translator of claim 6, wherein:

the first P-channel transistor of the first input stage has its source connected to the first voltage supply, its drain connected to the base of the first bipolar transistor of the output stage and to the first resistive element, and its gate connected to the first differential ECL signal; and the second P-channel transistor of the second input stage has its source connected to the first voltage supply, its drain connected to the base of the second bipolar transistor of the output stage and to the second resistive element, and its gate connected to the second differential ECL signal.

8. The ECL-to-BiCMOS/CMOS translator of claim 6, further comprising:

an ECL receiver means for receiving a single ECL signal and for generating the pair of differential ECL signals in response thereto.

9. The ECL-to-BiCMOS/CMOS translator of claim 6, wherein the first input stage further comprises:

a third P-channel transistor for coupling the first voltage supply to the output node of the output stage.

10. An ECL-to-BiCMOS/CMOS translator, comprising:

an ECL receiver means for receiving a single ECL signal and for generating a pair of differential ECL signals in response thereto;

an output stage having an output node for outputting a BiCMOS/CMOS level signal, the output stage further having a first bipolar transistor for coupling the output node to a first voltage supply and a second bipolar transistor for coupling the output node to a second voltage supply;

a first input stage for activating the first bipolar transistor of the output stage, the first input stage having a first P-channel transistor having its source connected to the first voltage supply, its drain connected to the base of the first bipolar transistor of the output stage, and its gate connected to a first one of the pair of differential ECL signals, the first input stage further having a resistive element connected between the drain of the first P-channel transistor and the output node of the output stage; and a second input stage for activating the second bipolar transistor of the output stage, the second input stage having a second P-channel transistor having its source-connected to the first voltage supply, its drain connected to the base of the second bipolar transistor of the output stage, and its gate connected to a second one of the pair of differential ECL signals, the second input stage further having a resistive element connected between the drain of the second P-channel transistor and the second voltage supply.

11. The ECL-to-BiCMOS/CMOS translator of claim 10, wherein the first input stage further comprises:

a third P-channel transistor having its source connected to the first voltage supply, its drain connected to the output node of the output stage, and its gate connected to the first one of the differential ECL signals.

12. An ECL-to-BiCMOS/CMOS translator, comprising;

an ECL receiver stage for generating a pair of differential ECL signals, the ECL receiver stage being connectable to a first voltage supply and to a second voltage supply having a lower voltage potential than the first voltage supply, the differential ECL signals each having a logic high value that has a lower voltage potential than the first voltage supply and a logic low value that has a higher voltage potential than the second voltage supply;

an output stage having an output node for outputting a BiCMOS/CMOS level signal, the output stage further having a first bipolar transistor for coupling the output node to a third voltage supply and a second bipolar transistor for coupling the output node to a fourth voltage supply;

a first input stage, responsive to a first one of the pair of differential ECL signals, for activating the first bipolar transistor of the output stage, the first input stage having a first field effect transistor for coupling a first resistive element between the third voltage supply and the output node of the output stage; and a second input stage, responsive to a second one of the pair of differential ECL signals, for activating the second bipolar transistor of the output stage, the second input stage having a second field effect transistor for coupling a second resistive element between the third voltage supply and the fourth voltage supply.

13. The ECL-to-BiCMOS/CMOS translator of claim 12, wherein the ECL receiver stage comprises:

a third bipolar transistor which generates the first differential ECL signal at its emitter, the third bipolar transistor having its collector connected to the first voltage supply and its emitter connected to a gate of the first field effect transistor; and a fourth bipolar transistor which generates the second differential ECL signal at its emitter, the fourth bipolar transistor having its collector connected to the first voltage supply and its emitter connected to a gate of the second field effect transistor.

14. The ECL-to-BiCMOS/CMOS translator of claim 13, wherein the ECL receiver stage further comprises:

a third resistive element connected between the emitter of the third bipolar transistor and the second voltage supply; and a fourth resistive element connected between the emitter of the fourth bipolar transistor and the second voltage supply.

15. The ECL-to-BiCMOS/CMOS translator of claim 14, wherein the ECL receiver stage further comprises:

a fifth bipolar transistor having its collector connected to a base of the third bipolar transistor; and a sixth bipolar transistor having its collector connected to a base of the fourth bipolar transistor;

wherein, the fifth and sixth bipolar transistors have their emitters connected together.

16. The ECL-to-BiCMOS/CMOS translator of claim 12, wherein the first input stage further comprises:

a third field effect transistor for coupling the third voltage supply to the output node of the output stage.

* * * * *